United States Patent
Nittka et al.

(10) Patent No.: US 10,955,499 B2
(45) Date of Patent: Mar. 23, 2021

(54) METHOD AND COMPUTER FOR PRODUCING A PULSE SEQUENCE FOR CONTROLLING A MAGNETIC RESONANCE IMAGING APPARATUS

(71) Applicant: Siemens Healthcare GmbH, Erlangen (DE)

(72) Inventors: Mathias Nittka, Baiersdorf (DE); Gregor Koerzdoerfer, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/376,180

(22) Filed: Apr. 5, 2019

(65) Prior Publication Data

US 2019/0310334 A1    Oct. 10, 2019

(30) Foreign Application Priority Data

Apr. 6, 2018    (EP) .................................... 18166126

(51) Int. Cl.
| | | |
|---|---|---|
| *G01R 33/44* | (2006.01) | |
| *G01R 33/561* | (2006.01) | |
| *G01R 33/56* | (2006.01) | |
| *G01R 33/24* | (2006.01) | |

(52) U.S. Cl.
CPC ......... *G01R 33/443* (2013.01); *G01R 33/243* (2013.01); *G01R 33/246* (2013.01); *G01R 33/561* (2013.01); *G01R 33/5608* (2013.01); *G01R 33/5613* (2013.01); *G01R 33/5614* (2013.01)

(58) Field of Classification Search
CPC combination set(s) only.
See application file for complete search history.

(56) References Cited

U.S. PATENT DOCUMENTS

| | | | |
|---|---|---|---|
| 10,180,476 B2* | 1/2019 | Cohen | G01R 33/4828 |
| 2016/0131729 A1* | 5/2016 | Kang | G01R 33/50 |
| | | | 324/309 |
| 2019/0242961 A1* | 8/2019 | Meineke | G01R 33/246 |

OTHER PUBLICATIONS

Ma, Dan et al.: "Magnetic Resonance Fingerprinting"; in: Nature; Mar. 14, 2013; vol. 495; No. 7440; pp. 187-192; DOI:10.1038/nature11971.
Gregor Körzdörfer et al: "Magnetic resonance field fingerprinting", Magnetic Resonance in Medicine., Oct. 15, 2018 (Oct. 15, 2018), XP055516998; US; ISSN: 0740-3194, DOI: 10.1002/mrm.27558; 2018.

(Continued)

*Primary Examiner* — Rishi R Patel
(74) *Attorney, Agent, or Firm* — Schiff Hardin LLP (57) ABSTRACT

In a method and magnetic resonance apparatus for generating a $B_0$ map of a region of interest, a magnetic resonance data set containing a number of image data sets is obtained and provided in a computer, wherein the image data sets are recorded using at least two measurement sequences and the mutually corresponding pixels of the image data sets each represent a time-dependent signal evolution. A $B_0$ map of the region of interest is generated by the computer from the image data sets, wherein the $B_0$ value of a pixel of the $B_0$ map is determined from the associated signal evolution.

11 Claims, 8 Drawing Sheets

(56) References Cited

OTHER PUBLICATIONS

Dongyeob Han et al.: "Development of magnetic resonance fingerprinting (MRF) combined with FISP and multi-echo SPGR acquisition for proton density, TI, T2, T2 and field mapping" ; Proceedings of the International Society for Magnetic Resonance in Medicine, ISMRM, 25th Annual Meeting and Exhibition, Honolulu, HI, USA, Apr. 22-Apr. 27, 2017; Nr. 3711, Apr. 7, 2017 (Apr. 7, 2017), XP040691279; 2017.

Riccardo Lattanzi et al: "Phase unwinding for dictionary compression with multiple channel transmission in magnetic resonance fingerprinting"; Magnetic Resonance Imaging, Bd. 49, 24. Dec. 2017 (Dec. 24, 2017), Seiten 32-38, XP055518025, Tarrytown, NY, US; ISSN: 0730-725X, DOI: 10.1016/j.mri.2017.12.015; 2017.

Gregor Körzdörfer et al.: "Contrast and Resolution Mixing for Magnetic Resonance Fingerprinting"; Proceedings of the International Society for Magnetic Resonance in Medicine, ISMRM, 25th Annual Meeting and Exhibition, Honolulu, HI, USA, Apr. 22-Apr. 27, 2017, Nr. 1404, Apr. 7, 2017 (Apr. 7, 2017); XP040688972,; 2017.

Susceptibility Weighted Imaging (SWI); Haacke et al., Magnetic Resonance in Medicine, vol. 52, pp. 612-618, 2004.

Coppo, Simone et al.: "Overview of Magnetic Resonance Fingerprinting"; in: Magnetom Flash; vol. 65, No. 2; pp. 12-21; XP055380755.; 2016.

Karsten Sommer et al.: "Towards Judging the Encoding Capability of Magnetic Resonance Fingerprinting Sequences"; Proceedings of the International Society for Magnetic Resonance in Medicine, ISMRM, 24th Annual Meeting and Exhibition, Singapore, May 7-May 13, 2016, Nr. 429, Apr. 22, 2016 (Apr. 22, 2016); XP040681472,; 2016.

E. Mark Haacke, et al., "Quantitative Susceptibility Mapping: Current Status and Future Decisions", Magnetic Resonance Imaging, 25 pgs., 2015.

* cited by examiner

METHOD AND COMPUTER FOR PRODUCING A PULSE SEQUENCE FOR CONTROLLING A MAGNETIC RESONANCE IMAGING APPARATUS

BACKGROUND OF THE INVENTION

Field of the Invention

The invention relates to a method for generating a $B_0$ map of a region of interest. The $B_0$ field is the static, homogeneity basic magnetic field that is produced in a magnetic resonance (MR) scanner in order to establish an equilibrium position of nuclei (nuclear spins) in an examination subject. The present invention also concerns an MR apparatus in the non-transitory, computer-readable data storage medium, encoded with programming instructions, for implementing such a method.

Description of the Prior Art

The term susceptibility in general describes the magnetizability of a substance or more specifically of a tissue. Patient's tissues in particular are subject to susceptibility differences depending on the tissue composition, e.g. the blood volume fraction. Step changes in susceptibility arise at the interfaces between tissues with different susceptibility, e.g. at the transition from body tissue to ambient air or air-filled cavities in the body. These susceptibility step changes can cause signal losses in the acquisition of the MR signals.

This results from the relationship of the magnetic field strength B with the magnetic excitation H and the magnetization J:

$$B=\mu_0(H+J).$$

As the magnetization J can also be expressed as a function of the susceptibility $\chi$ as $$J=\chi H$$

this means $$B=\mu_0\mu_R H=\mu_0(1+\chi)H=B_0\mu_0 J$$

At the interface between two tissues or substances with different □-values, a gradient □B is therefore produced:

$$\Delta B=\mu_0(\chi_1-\chi_2)H$$

The additional gradients present at the interfaces cause the orientation of the signal-generating magnetic moments to be unequal, resulting in signal losses e.g. due to dephasing within the voxel and changes in signal phase.

Since disease-related bleeding or even calcifications may be produced in the tissue, maps of the susceptibility distribution or susceptibility step changes can also be of diagnostic value.

Different methods of quantifying susceptibility are known. In Haacke et al., Quantitative susceptibility mapping: current status and future directions, Magnetic Resonance Imaging 33 (2015) pp. 1-33, a number of methods are presented in which a phase image is always evaluated.

Other quantifiable parameters are known. There are parameters that depend on the patient or region of interest, e.g. the relaxation times $T_1$, $T_2$ and $T_2^*$, the spin density, diffusion-dependent parameters such as the ADC or even flow rates. However, hardware-dependent variables may also be a factor, e.g. the strength of the RF field $B_1$ that is radiated in order to excite the nuclear spins.

Individual tissues are assigned average values of the parameters. White brain mass has a particular $T_1$ and $T_2$ value. This assignment can at least be made on a device, always using the same measurement sequence.

Diseases can cause a change in the patient-dependent parameters. A large number of studies therefore exist that assign changes in a particular parameter to a disease. Narrowing of vessels is manifested by an increase in flow rate, carcinomas change the relaxation times, etc.

Quantifying the patient-dependent parameters is therefore likewise diagnostically useful for therapy support. A large number of methods exist for quantifying individual parameters in each case. At least a dozen procedures can be used for measuring the $T_1$ relaxation time alone. In each case the resulting $T_1$ time varies within certain limits.

This, together with the hardware-dependence of the tissue parameters, means that the informative value of the parameter maps is too low compared to the scan time involved so as to be of comprehensive use. Instead, it is customary to record weighted images. That is to say, a spin echo with a short repetition time $T_R$ is used to obtain a $T_1$ weighting. Conversely, in order to achieve a $T_2$ weighting, a long echo time $T_E$ is used. In this way weightings can be performed for many tissue parameters in order to obtain the necessary image data within an acceptable time. This also applies to the susceptibility measurements. The acronym for susceptibility weighted imaging is SWI.

A more recent approach for obtaining the tissue parameters is so-called magnetic resonance fingerprinting, or MR fingerprinting or MRF for short. Ma D. et al: Magnetic resonance fingerprinting. Nature 495, pp. 187-193 (2013) proposes using pseudorandomized measurement parameters. In a bSSFP sequence, measurement parameters are changed after an image is taken. Specifically, the repetition time and the flip angle of the excitation pulse are varied. However, the measurement takes place in one step so that the output magnetization after recording of the first image constitutes the input magnetization of the second image.

The measuring signals thus obtained produce a signal evolution for each pixel of the recorded images. This signal evolution depends on $T_1$, $T_2$ and $B_0$. $B_0$ is a variable which is hardware-influenced, i.e. by the field distribution of the externally applied static magnetic field and local changing of the magnetic field in the body due to the variable susceptibility thereof.

In order to obtain the parameters, two tissue parameters and one hardware parameter, from the signal evolutions, the procedure is as follows:

For each parameter, the signal evolution is simulated for a set of predefined values. Simulated signal evolutions are therefore created for $T_1$ e.g. in 100 ms increments, for $T_2$ in 10 ms increments and for $B_0$ in 0.1 Hz increments. If 50 values are taken for $T_1$, 50 for $T_2$ and 100 for $B_0$, the dictionary will contain 250,000 entries. After the measurement, the dictionary is consulted, for each pixel, as to which of the simulated signal evolutions is the best fit for that measured. This procedure is termed matching. The values of $T_1$, $T_2$ and $B_0$ stored for the signal evolution providing the best match are then the ones that are determined for the pixel.

This procedure has numerous advantages. A number of parameter maps are obtained using one measurement. Moreover, in addition to the tissue parameters $T_1$ and $T_2$, the hardware parameter $B_0$ is also measured. This eliminates the problem of the dependence of the tissue parameters on this value.

One disadvantage is that, in the case of the sequence used in Ma's study, the long spiral readout means that there is a lower limit for the repetition time, resulting in bSSFP-typical artifacts in the event of local $B_0$ changes.

SUMMARY OF THE INVENTION

An object of the present invention is to provide a method for generating a $B_0$ map, the method having a high SNR efficiency, and is artifact-free, and is therefore suitable for the clinical routine.

This object is achieved in accordance with the invention by a method for generating a $B_0$ map of a region of interest that has the following steps.

A magnetic resonance data set containing a number of image data sets is provided to a computer, wherein the image data sets were recorded using at least two measurement sequences and the mutually corresponding pixels of the image data sets each represent a time-dependent signal evolution. A $B_0$ map of the region of interest is generated by the computer from the image data sets, wherein the $B_0$ value of a pixel of the $B_0$ map is determined from the associated signal evolution.

In known methods for creating $B_0$ maps, a single measurement sequence such as spin echo, fast spin echo, TrueFISP, etc. is used. For this purpose, one or more measurement parameters such as e.g. the echo time $T_E$ or the repetition time $T_R$ are varied in a selectively or randomly distributed manner. Either the model functions are fitted to the varied parameter(s) or matches with simulated signal evolutions are sought.

As described, instead of one measurement sequence, at least two different measurement sequences are used. This enables artifacts to be prevented and the quality of the $B_0$ values obtained to be increased, as will be described in greater detail below.

As in known methods, the analysis is performed pixel by pixel. Each image data set has a large number of pixels. The image data sets are usually acquired with a consistent resolution, i.e. same FoV and same number of pixels in all directions. From mutually corresponding pixels, a signal evolution is then plotted either against the varied parameter or against time. As stated, this takes place pixel by pixel. Thus, solely as an example, the pixels (23,65) can be used in all the image data sets to obtain a signal evolution.

The evaluation is then performed for all the pixels or an ROI (region of interest) in order to generate a parameter map. It is therefore not obligatory to always evaluate all the pixels.

Therefore, where a signal evolution is discussed in the following, this refers to the basic procedure. Where the plural is used, i.e. signal evolutions, this means that the description applies to one pixel, but is carried out altogether for a number of pixels.

The formulations used relate to the reconstructed image data sets and do not imply Cartesian k-space sampling. This also becomes clear in the embodiments which are all based on spiral sampling of k-space. However, such sampling is also not obligatory for carrying out the method but is merely preferable.

Advantageously, a susceptibility map can be derived from the $B_0$ map. The susceptibility map is designed to show small-scale field changes, caused by local tissue changes, e.g. due to blood clots or also calcifications. The susceptibility map is not designed to show the large-scale field changes of the kind typically produced by inhomogeneities in the hardware-side main magnetic field. In order to eliminate the large-sale, slowly varying field changes, a low-pass filter can be applied to the $B_0$ map extracted from the original $B_0$ map in order to obtain the susceptibility map. Similarly, a high-pass filter can also be applied to the $B_0$ map in order to obtain the susceptibility map. The susceptibility map can therefore be obtained without the evaluation of phase information. Ultimately the radio-frequency components must therefore be extracted.

It should be noted that the phase information just mentioned relates to the complex measured (detected) signal, for which magnitude and phase value exist. Phase cycles and also in this context phases will be discussed below. Here, however, the deflection direction of radio-frequency pulses is meant. Despite the same name, quite different elements are therefore designated.

Preferably a $B_1$ value is also determined from the signal evolutions in each case. This means, a $B_1$ map can also be determined from the magnetic resonance data set. An advantage of the proposed method is therefore that this hardware parameter emerges from the experiment as a concomitant result and the experiment does not have to be designed such that it does not influence the measurement.

For recording of the magnetic resonance data set at least two sections can be present and, in at least one section, image data sets are recorded using a TrueFISP measurement sequence and, in at least one section, image data sets are recorded using a FLASH measurement sequence.

The term sequence or measurement sequence denotes as usual a succession of RF pulses, gradient fields, delay times and acquisition windows, which precisely define and characterize the course of the measurement sequence. Examples of measurement sequences include the FLASH and TrueFISP already mentioned. Other examples of measurement sequences are gradient echo, EPI, spin echo, TSE (turbo spin echo), etc.

The bSSFP mentioned in the introduction is the acronym for balanced steady-state free precession and is also called TrueFISP. Like FISP, it is a sequence which is used in steady-state longitudinal and transverse magnetization. In contrast, only longitudinal magnetization is used for FLASH or SPGR sequences.

TrueFISP is understood as meaning a sequence design in which the sum of all the moments equals 0 after a repetition time $T_R$. With FISP, at least one of the moments is not balanced out.

This combination makes it possible to obtain the desired parameters simultaneously and with reduced artifacts.

In addition, in at least one section, image data sets can be recorded using a FISP measurement sequence. The use of a FISP measurement sequence helps to further reduce artifacts.

The measured signal evolutions can be compared with simulated signal evolutions in each case to determine the $B_0$ value or the $B_0$ value and at least one other parameter value. In other words, an evaluation as known from MR fingerprinting can therefore be used. The simulated signal evolutions can be available as a dictionary. The best match determines the parameter sought.

With particular advantage, for simulation of the signal evolutions only a reduced $B_0$ value range can be covered. As described above, the simulation basis increases with each incoming parameter. It has been found that the dictionary can be limited to a manageable size, even including $B_0$, by limiting the incoming $B_0$ value range.

The $B_0$ value range can be limited to values of $-(1/T_R)/2$ to $+(1/T_R)/2$. Measuring signals with $dB_0=x+n*(1/T_R)$ differ only slightly from measuring signals with $B_0=x$, where x is real and n is an integer. Accordingly, a dictionary of limited size can be compiled. The $B_0$ values still contained in the dictionary can also be termed reference $B_0$ values.

The $B_0$ map does not only contain values from the limited value range of the reference $B_0$ values. On completion of the comparison with the simulated signal evolutions, the reference $B_0$ values determined by the comparison can be expanded to include $B_0$ values outside the reduced range. Limiting to a smaller $B_0$ value range therefore takes place as long as this confers advantages, and the range will be expanded again thereafter. The limiting described offers the following advantages: the simulation is faster, the storage space for the simulated signal evolutions is less and, above all, the computing time for matching is significantly reduced. This reduction is particularly relevant for limiting the $B_0$ value range.

An extension $B_0$ map can be determined by calculating it from at least one part of the image data sets acquired using the FISP measurement sequence. As described below, for the FISP measurement sequence the echo time $T_E$ is preferably varied. This makes it possible to calculate a rough extension $B_0$ map from these image data sets. Using this extension $B_0$ map, the $B_0$ values can be transformed to a $B_0$ value range which contains values outside the reduced $B_0$ value range. Altogether, however, the time for the matching can be reduced by a much greater amount than that taken up by the supplementary calculation.

This is possible, as the signal evolutions naturally contain the complete information and, merely on the basis of the existing quasi-periodicity in $B_0$, the evaluation can be limited in this dimension.

A $T_1$ value and a $T_2$ value can be advantageously determined from the signal evolutions in each case. The more values can be determined from the signal evolutions, the more universally the method can be used. The procedure described also allows $T_1$ values and $T_2$ values to be determined.

Cartesian sampling of k-space can be used for all the measurement sequences. Alternatively, radial sampling can be used.

Advantageously, spiral sampling of k-space can be used for at least one of the measurement sequences that is used. Spiral k-space sampling can preferably be used for all the measurement sequences and for acquisition of all the image data sets.

With spiral sampling, a complete image data set can be recorded after each radio-frequency pulse. The sequences differ only in the gradients applied in a repetition time $T_R$.

In this embodiment the definition of the repetition time $T_R$ is indeed as usual, namely the time between two corresponding consecutive points in a series of radio-frequency pulses and signals. As only one radio-frequency pulse then occurs in a repetition time also in the case of TrueFISP, the differences between the sequences are not immediately apparent. In particular, phase cycles are then present over a plurality of image data sets and not, as in the case of Cartesian sampling, over a number of k-space lines.

Nevertheless, the measurement sequences described are those as indicated by the name.

For at least one measurement sequence, the image data sets are advantageously recorded without steady state. With particular preference, more than half of the image data sets are recorded without steady state. In addition, more than 75% can be recorded without steady state. Preferably all the image data sets can be recorded without steady state.

In the case of pure imaging, FLASH and TrueFISP image data sets are recorded for the most part under steady state conditions. However, compared to a plurality of acquisitions, this provides no information, as the signal evolution stagnates, so to speak.

In practice this can be implemented e.g. such that an image data set is recorded by a FLASH sequence using a flip angle of 4° and the next image data set, also acquired using a FLASH sequence, with a flip angle of 6°, etc. For the spiral sampling described later, this is sufficient to prevent a steady state.

Preferably a reception coil array can be used to record the image data sets. In other words, the image data sets are acquired by parallel imaging. K-space can then be undersampled or recorded in a more heavily undersampled manner than in the case of spiral sampling.

It has been noted in the introduction that a pseudorandomized distribution of measurement parameters can take place. In contrast to the known prior art, with the proposed method the repetition time $T_R$ is preferably kept constant.

For Cartesian sampling the following embodiments can be used. In a first embodiment, the sampling is kept constant in an image data set, but can change if the same measurement sequence is run repeatedly and, above all, when the measurement sequence switches. In another embodiment the repetition time $T_R$ is constant even if the same measurement sequence is run repeatedly. All the FLASH in a section are therefore recorded with the same repetition time $T_R$. However, the repetition time $T_R$ can change if the sequence is switched to TrueFISP or vice versa. It can also differ if the FLASH sequence is used again in a later section. In a third embodiment the repetition time $T_R$ remains constant throughout measuring signal recording.

For spiral sampling during which a complete image data set is acquired after a radio-frequency pulse, the first embodiment is not applicable. The repetition time $T_R$ can then preferably be kept constant either in each section or across all sections.

This is a change in strategy in that the signal evolution is no longer characterized by the continuous changing of a plurality of measurement parameters but, among other things, by the change of measurement sequence.

Following this line, image data sets can be advantageously recorded using a FISP sequence in at least one section. A FISP sequence influences the signal evolution differently again from FLASH or TrueFISP and thus helps to make more parameters differentiable.

At least one parameter of the scanned object can be determined from at least one signal evolution. This makes it clear that the method described forms the basis for determining, i.e. quantifying, a tissue parameter, i.e. $T_1$ or $T_2$, for example.

As suggested above, the method described is based on the MR fingerprinting concept. In conventional quantifying methods, a single measurement sequence is used and a single measurement parameter, e.g. $T_E$, is varied in order to thus determine a tissue parameter such as $T_2$. This should not exclude the possibility of also obtaining tissue parameters in another way by means of the method proposed.

For the encoding of the parameters to be determined, the flip angle is preferably varied as the single measurement parameter in at least one measurement sequence. As described earlier, the parameters to be determined can be $B_0$, $B_1$, $T_1$, $T_2$, ADC, etc. Neither the repetition time $T_R$ nor the echo time $T_E$ are therefore changed. This embodiment is preferably performed for acquisitions using the FLASH measurement sequence and/or TrueFISP measurement sequence.

Alternatively or in addition, in at least one measurement sequence the flip angle and the echo time $T_E$ are varied as single measurement parameters.

For all the measurement sequences apart from the FISP sequence, the flip angle is preferably varied as the single measurement parameter. In the case of the FISP sequence, the flip angle and the echo time $T_E$ can preferably be varied as single measurement parameters.

In this connection, the radio-frequency pulse phase is now briefly discussed. This is likewise a measurement parameter and changes when a phase cycle is used, as will be described below. However, it is a variable that is changed in order to compensate hardware imperfections or is an intrinsic part of the measurement sequence. Such measurement parameters are also varied without parameter quantification. By definition, a phase cycle is accordingly not one of the measurement parameters to be changed. Nevertheless, the phase cycles described are an integral part of the invention, namely as a second variable value in addition to the measurement parameters.

More precisely, for encoding of the parameters to be determined, the flip angle shall therefore be varied as the single measurement parameter influencing the measuring signal as a function of at least one parameter. In other words, for encoding of the parameters to be determined, the flip angle □ shall be varied as the single measurement parameter from the group repetition time $T_R$, echo time $T_E$ and flip angle □. This applies in particular to the FLASH and/or TrueFISP measurement sequence.

Alternatively, as described for the FISP measurement sequence, for encoding of the parameters to be determined, the flip angle □ and the echo time $T_E$ can be varied as single measurement parameters from the group repetition time $T_R$, echo time $T_E$ and flip angle □.

The flip angle can follow a predefined distribution over a plurality of image data sets. It is therefore no longer pseudorandomized but varied using a strategy. In one embodiment the flip angle can follow a normal distribution. It therefore begins with small flip angles. The flip angle increases to a maximum value and then decreases again.

In another embodiment the distribution is shaped like a half-sinusoid, in particular the positive half. The distribution rises more steeply compared to a normal distribution and has a wider plateau in the maximum region.

In another embodiment the distribution is shaped like a $sin^2$ curve, so it rises even more steeply than a sinusoidal curve.

There is preferably at least one distribution in a section. In particular, there is just one distribution in at least one section. In addition, there can be just two distributions in a section.

Advantageously, a normal distribution can be followed in a section in which image data sets are acquired using a FLASH measurement sequence.

The flip angles preferably follow a $sin^2$ distribution in a section in which image data sets are recorded using a FISP or TrueFISP measurement sequence.

Preferably some of the image data sets are measured one after another without a pause. In other words, the initial magnetization can be adopted by the subsequent sequence. As already described, it is a question of generating signal evolutions which exhibit variations depending on the measurement sequences and on the parameters to be determined. These are absent in acquisition pauses, as the acquired measuring signal is then more heavily dependent on the initial magnetization $M_0$ than on the preceding sections.

Advantageously all the image data sets are measured one after another without a pause. There is then a pulse of basically any length between two sections.

Preferably all the sequences or rather image data sets, i.e. also in the case of a measurement sequence change or section change, are measured one after another without a pause.

For example, a FLASH with a large flip angle at relatively small $T_R$ can be used to record an image data set. Although even this provides information about $T_1$, these findings become better if the subsequent acquisition, a FLASH with a smaller flip angle, starts with the magnetization at the end of the preceding FLASH than if the magnetization is relaxed again to $M_0$ by a pause.

Acquisition with pauses also no longer constitutes a signal evolution, but only individual measuring points.

However, the use of a number of measurement sequences alone does not yet produce the optimum procedure for minimizing the number of image data sets in the magnetic resonance data set. A preferred embodiment has emerged wherein, in three consecutive sections, first a FISP sequence, then a TrueFISP sequence and then a FLASH sequence is used. That is to say, initially a plurality of FISP image data sets are recorded, wherein basically any number of image data sets can be recorded in a section, as long as it takes place using the same measurement sequence. However, this does not mean that all the measurement parameters of the sequence would have to remain the same in a section. Here there may be a variation e.g. to prevent a steady state. It is preferable, as already described in detail, to vary the flip angle.

A section then follows in which a number of image data sets are acquired using a TrueFISP sequence and then a section using a FLASH sequence. In the last section a plurality of image data sets are also acquired using the FLASH sequence.

This succession of FISP, TrueFISP and FLASH sequences will hereinafter be referred to as a block.

The succession described, i.e. the block, can be repeated at least once. The block is therefore run at least twice. The succession is preferably run exactly three times.

At least 10 image data sets can be recorded with each sequence. Preferably at least 10 image data sets are recorded per section. In three blocks there are then at least 90 image data sets available. This is a significantly larger number of sampling points in the signal evolution than in the case of conventional parameter maps in which often only six to ten sampling points are available.

The TrueFISP sequence can have at least one phase cycle in at least one section. A phase cycle is understood as meaning a predefined succession of the phases of particular or all radio-frequency pulses. This is a variable dependent on the flip angle.

The aforementioned at least one phase cycle is preferably a 180° phase cycle. The phases of the radio-frequency pulses of the TrueFISP sequence then alternate from x to −x or from y to −y and vice versa.

Alternatively, this phase cycle can be designed as a 90° phase cycle. The phases can then change, for example, from x to y to −x to −y and then all over again.

As another alternative, this phase cycle can be designed as a 270° phase cycle. Here one phase cycle is preferably used for each distribution. In the case of three distribution of the flip angle, three different phase cycles can therefore also be used. In the case of more distributions, more phase cycles can also be used.

For the TrueFISP sequence, two phase cycles can be used in a section. A 180° phase cycle can be used as one phase cycle and a 90° phase cycle can be used as another phase cycle. The 180° phase cycle can preferably be used as the first phase cycle. By changing the phase cycle, cycle-related artifacts such as the position of the "dark band" can be varied or prevented.

A predefined phase can be used for the FISP sequence. The same phase is preferably used each time a FISP sequence is acquired.

RF spoiling can be used when using the FLASH sequence. RF spoiling means that a phase cycle is used with which a possible $T_2$ weighting of the magnetization is prevented. The additional phase can preferably be 117° or a multiple thereof. The phase to be used is produced from the preceding phase by adding a multiple of 117°. The very first phase can be arbitrarily selected and need not be a multiple of 117°. Relating to the multiples, 117° also counts as a single multiple.

The present invention also encompasses a non-transitory, computer-readable data storage medium encoded with programming instructions that, when the storage medium is loaded into a control computer or computer system of an magnetic resonance apparatus, cause the computer or computer system to operate the magnetic resonance apparatus so as to implement any or all embodiments of the method according to the invention, as described above.

The invention also concerns a magnetic resonance apparatus having a control computer designed to carry out the method as described.

The abovementioned method can be implemented in the control device as software or as well as (hardwired) hardware.

Other advantageous embodiments of the magnetic resonance apparatus according to the invention correspond to the embodiments of the method according to the invention as described above.

DESCRIPTION OF THE PREFERRED EMBODIMENTS

Figure 1:
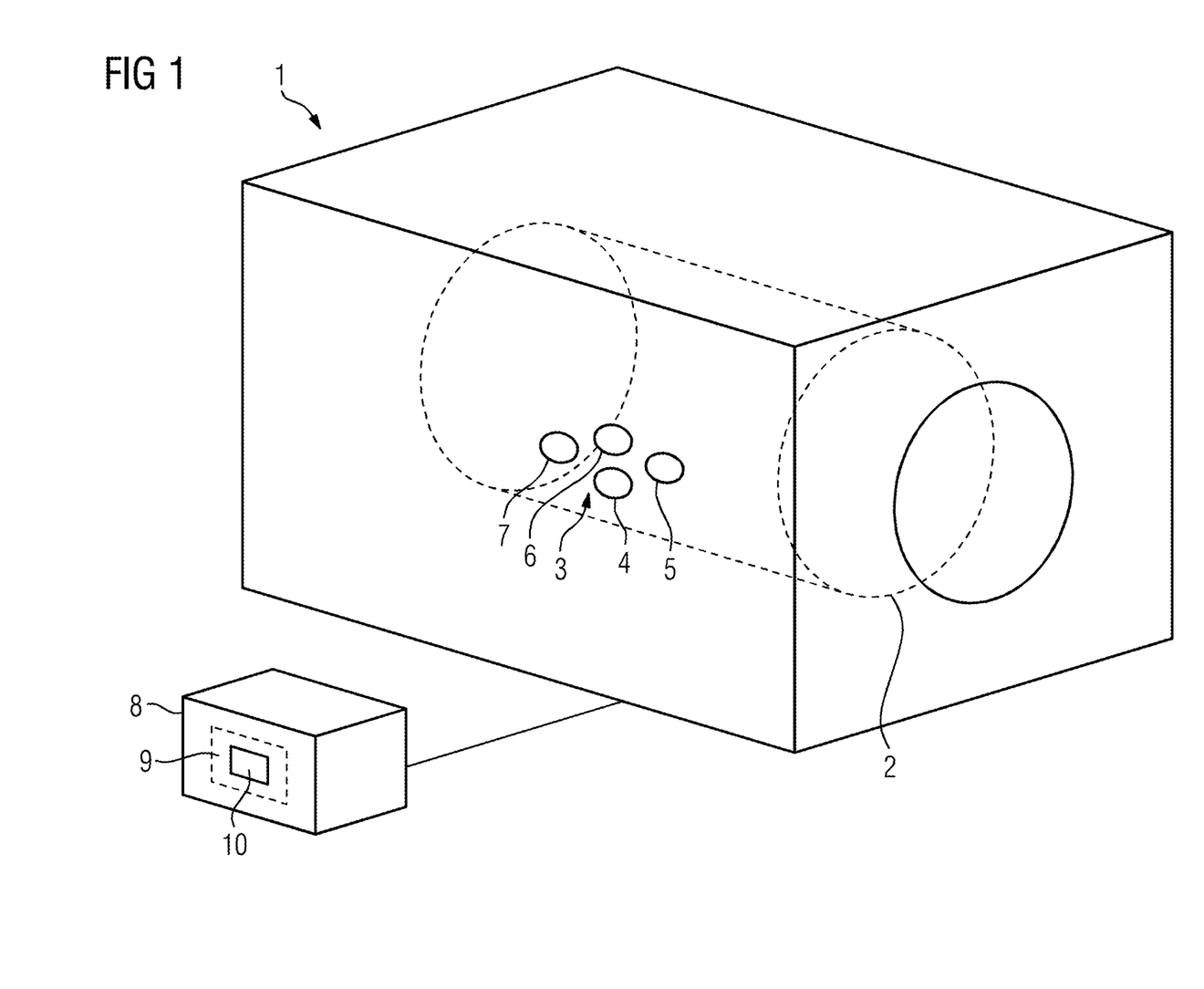
FIG. 1 schematically illustrates a magnetic resonance apparatus.

FIG. 1 shows a magnetic resonance apparatus 1 having a transmit coil arrangement 2. The transmit coil arrangement 2 can be designed as a body coil, but can also be a transmit coil array. The transmit coil arrangement 2 is shown by dashed lines.

For data acquisition, the magnetic resonance apparatus 1 has a reception coil arrangement 3. The reception coil arrangement 3 is preferably a coil array having coils 4, 5, 6 and 7. The coils 4, 5, 6 and 7 therefore detect MR signals simultaneously and therefore in parallel.

To control the data acquisitions (scans), the magnetic resonance apparatus 1 has a control computer 8.

As part of the control computer 8 or independently thereof, the magnetic resonance apparatus 1 also has a non-transitory data storage medium 9 on which computer programs 10 for carrying out magnetic resonance measurements are stored.

For clarity, other components of the magnetic resonance apparatus 1 such as e.g. gradient coils or patient table are not shown.

Figure 2:
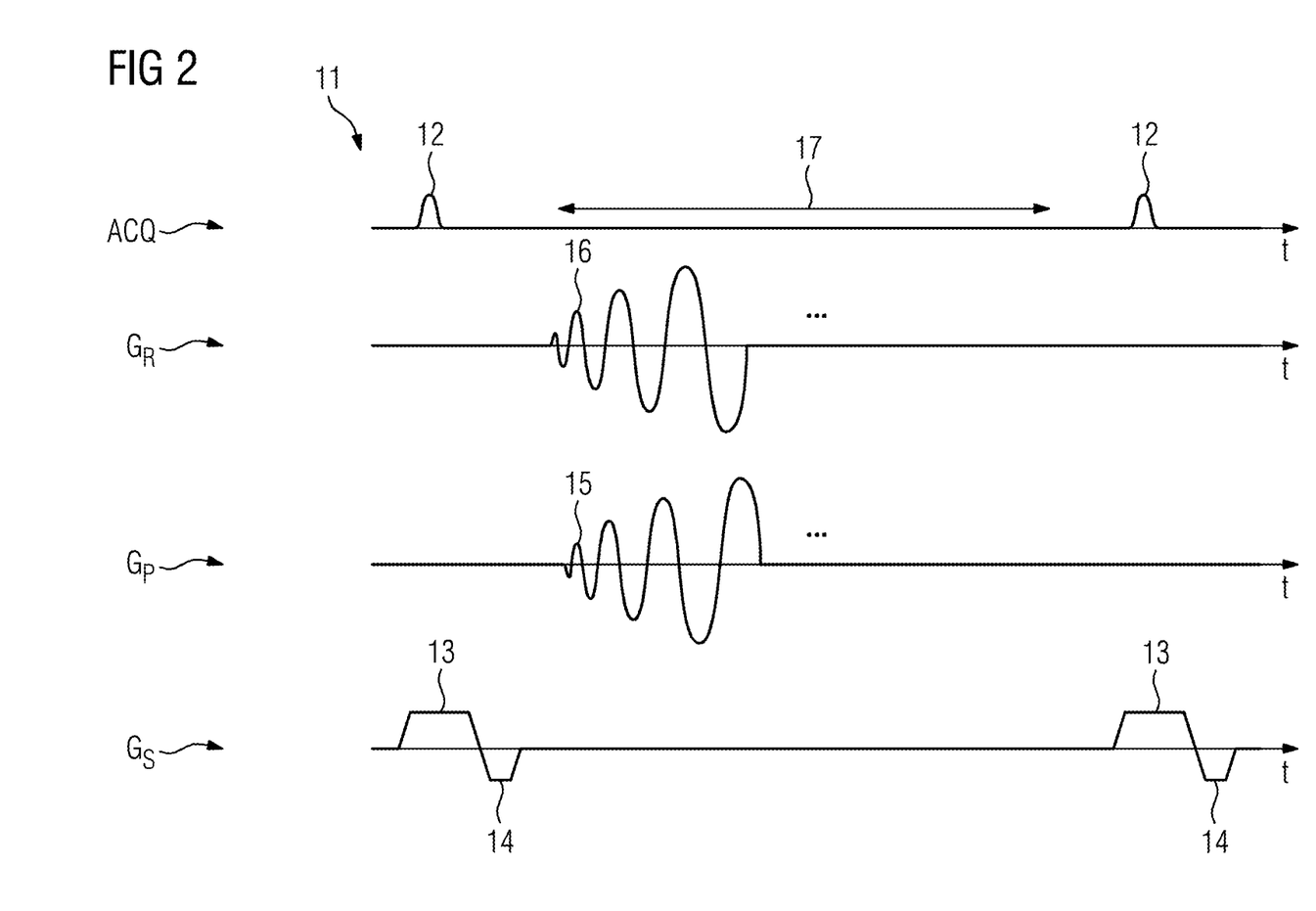
FIG. 2 shows a FLASH measurement sequence.

FIG. 2 shows a FLASH measurement sequence diagram 11. The gradient axes are as usual labeled $G_R$ for the read direction, $G_P$ for the phase encoding direction and $G_S$ for the slice selection direction. ACQ denotes the axis for the radio-frequency pulses and the acquisition windows.

A FLASH is a gradient-echo-based sequence using a radio-frequency pulse 12 whose flip angle is less than 90°. A $T_2^*$ contrast can be set via the echo time $T_E$ and a $T_1$ contrast via the repetition time $T_R$. The radio-frequency pulse typically has a flip angle of between 4° and 30° for weighted measurements.

In order to excite a single slice using the radio-frequency pulse 12, a slice selection gradient 13 is applied simultaneously with the radio-frequency pulse 12 in the slice selection direction $G_S$. In order to compensate its dephasing effect on the magnetization in the transverse plane, the slice selection gradient 13 is directly followed by a slice rephasing gradient 14.

In the phase encoding direction $G_P$ a phase encoding gradient 15 is used. Like the read gradient 16 in the read direction $G_R$, this is applied in an oscillating manner. This is preferably performed in order to sample the k-space spirally. As already described above, Cartesian or radial sampling can also be performed instead.

MR signals 17 can be acquired accordingly.

It is important to note in this context that an entire image data set is recorded in the repetition time $T_R$. The FLASH measurement sequence 11—like the other measurement sequences discussed—is therefore a kind of single-shot sequence, as a single radio-frequency pulse 12 suffices to obtain a complete image data set.

The raw data set thus acquired can be converted into an image data set by a non-uniform Fourier transform. It may be prone to artifacts, but this is sufficient for matching.

The second radio-frequency pulse 12 on the right side of the drawing shows that, after recording of the first image data set, the second image data set is commenced without a pause. As will be described in more detail below, the second radio-frequency pulse 12 can have a flip angle different from that of the first radio-frequency pulse 12. In addition, the phase for implementing a phase cycle can change. SNR problems can be reduced by parallel imaging, as less k-space data has to be recorded, thereby enabling the repetition time $T_R$ to be reduced.

Figure 3:
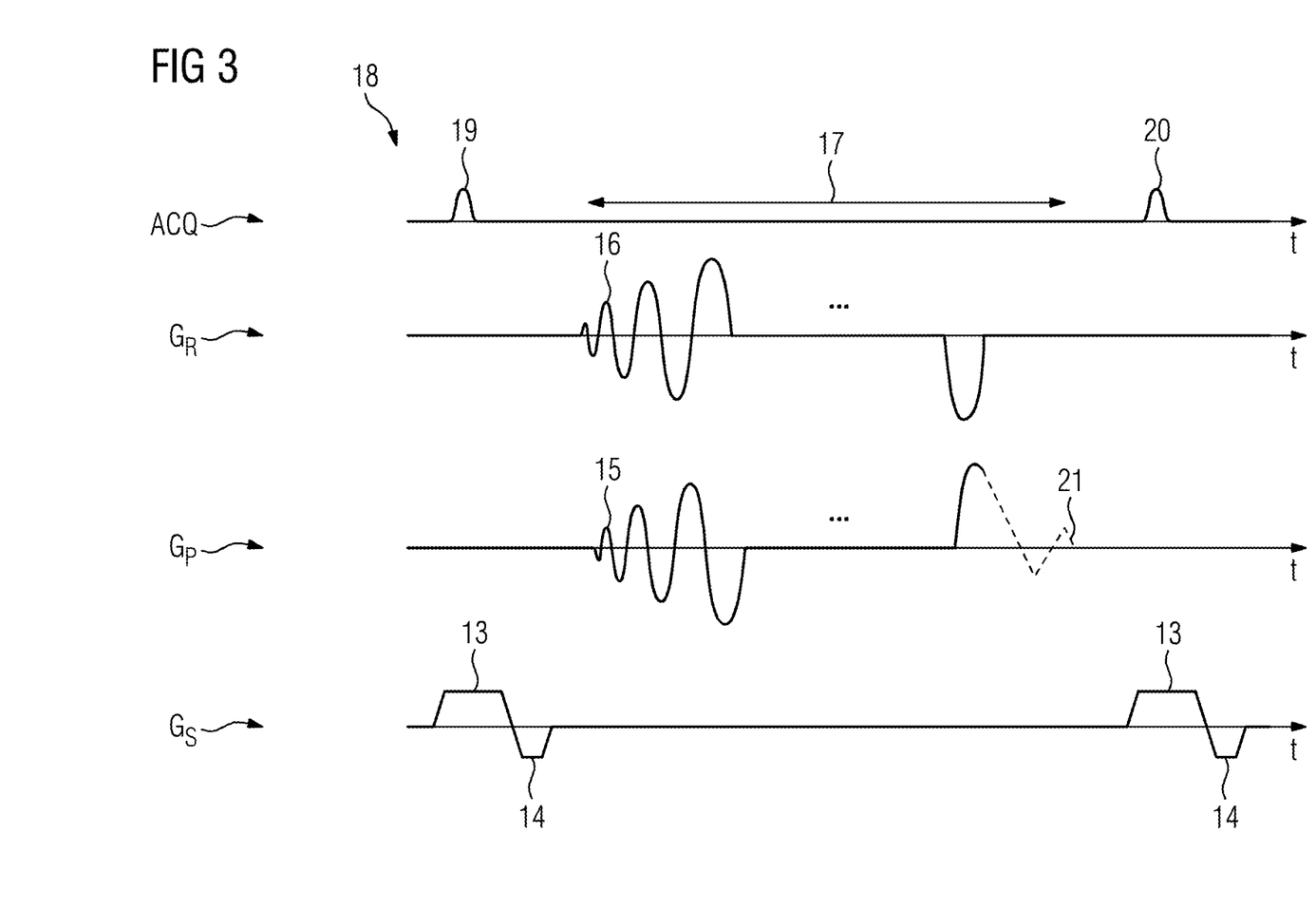
FIG. 3 shows a FISP measurement sequence.

FIG. 3 shows a FISP measurement sequence 18. For this, only one radio-frequency pulse 19 is likewise used to record a complete image data set.

As specified for the FLASH measurement sequence 11, a slice selection gradient 13, a slice rephasing gradient 14, a phase encoding gradient 15 and a read gradient 16 are present.

In addition, a phase rewind gradient 21 is present. This ensures that the sum of the gradient moments in the phase direction equals zero over a repetition time $T_R$.

In the slice direction $G_S$, the sum of the gradient moments is non-zero over a repetition time $T_R$.

In the read direction $G_R$, the gradients are balanced, but this is not obligatory. The sum of the gradients in the read direction $G_R$ can therefore also be non-zero over a repetition time. As spiral trajectories are recorded, the resulting total moment is always the same, as the individual gradient moments always have the same evolution over a repetition time.

The second image data set is begun with the radio-frequency pulse 20. This preferably has the same phase as the preceding radio-frequency pulse 19, but has a different flip angle.

Figure 4:
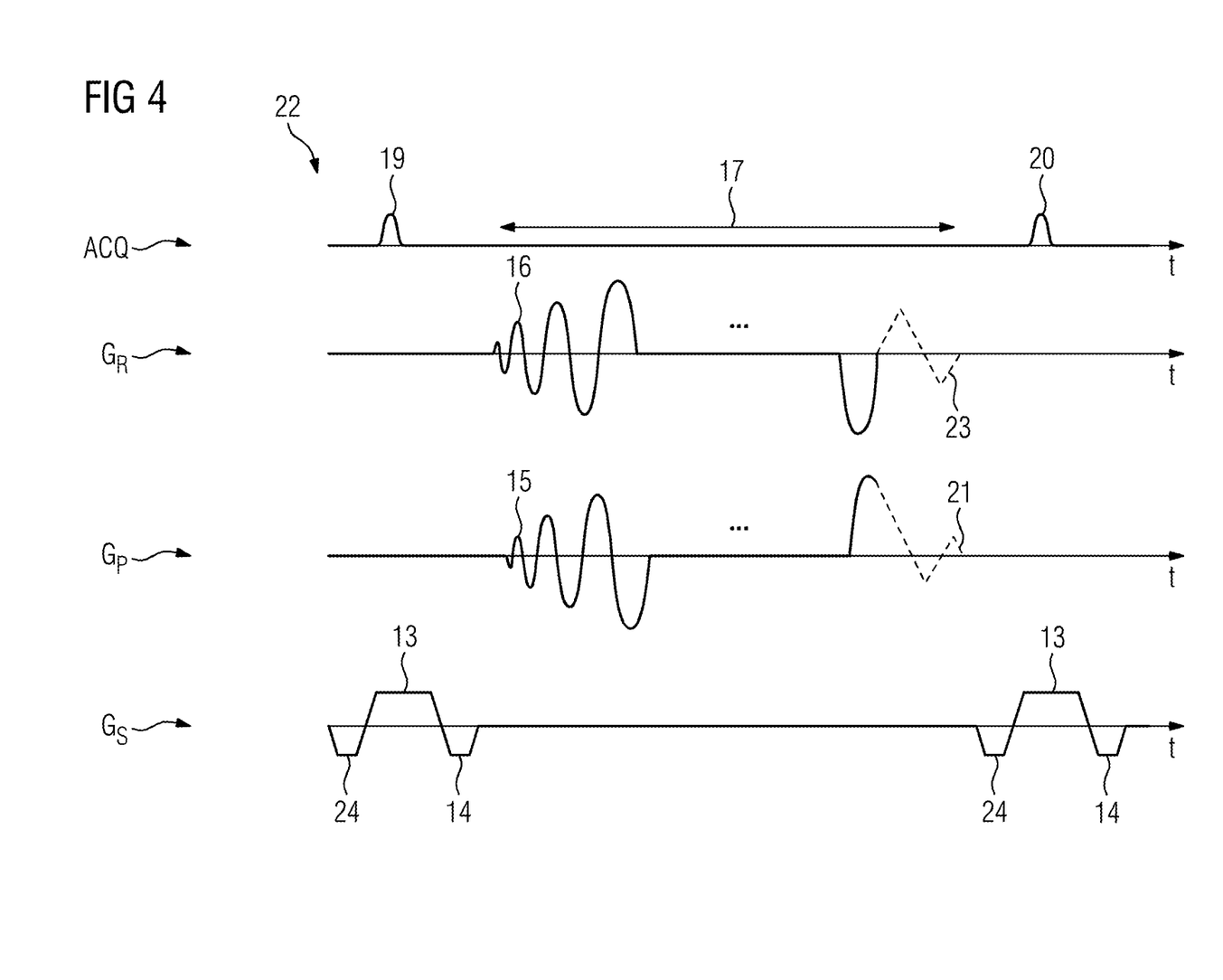
FIG. 4 shows a TrueFISP measurement sequence.

FIG. 4 shows a TrueFISP measurement sequence 22. Here reference can basically be made to the remarks concerning the FLASH measurement sequence 11 and also the FISP measurement sequence 18.

In addition to the components already mentioned, the TrueFISP measurement sequence 22 involves a read-rewind gradient 23 and a slice dephasing gradient 24. As a result, the TrueFISP measurement sequence 22 is "fully balanced" over a repetition time $T_R$, i.e. the sums of the gradient moments are equal to zero over a repetition time $T_R$. Also in the case of the TrueFISP measurement sequence 22, the absolute values of the flip angles of the radio-frequency pulses 19 and 20 vary.

As already described, the TrueFISP measurement sequence 22 can have phase cycles. As already described, a 90° phase cycle can be used. The first radio-frequency pulse 19 then has a phase $\varphi$, the second radio-frequency pulse 20 a phase ($\varphi$+180°), the third radio-frequency pulse 25 a phase ($\varphi$+90°), the fourth radio-frequency pulse a phase ($\varphi$+270°), the fifth radio-frequency pulse a phase ($\varphi$+180°, the sixth radio-frequency pulse a phase ($\varphi$+360°), etc.

A 180° phase cycle then jumps with 180° increments instead of with 90° increments and a 270° phase cycle with 270° increments.

For all the measurement sequences 11, 18 and 22, the scheme for recording an image data set and the radio-frequency pulse including gradients in the slice selection direction $G_S$ of the next image data set is shown in order to clarify the procedure.

Figure 5:
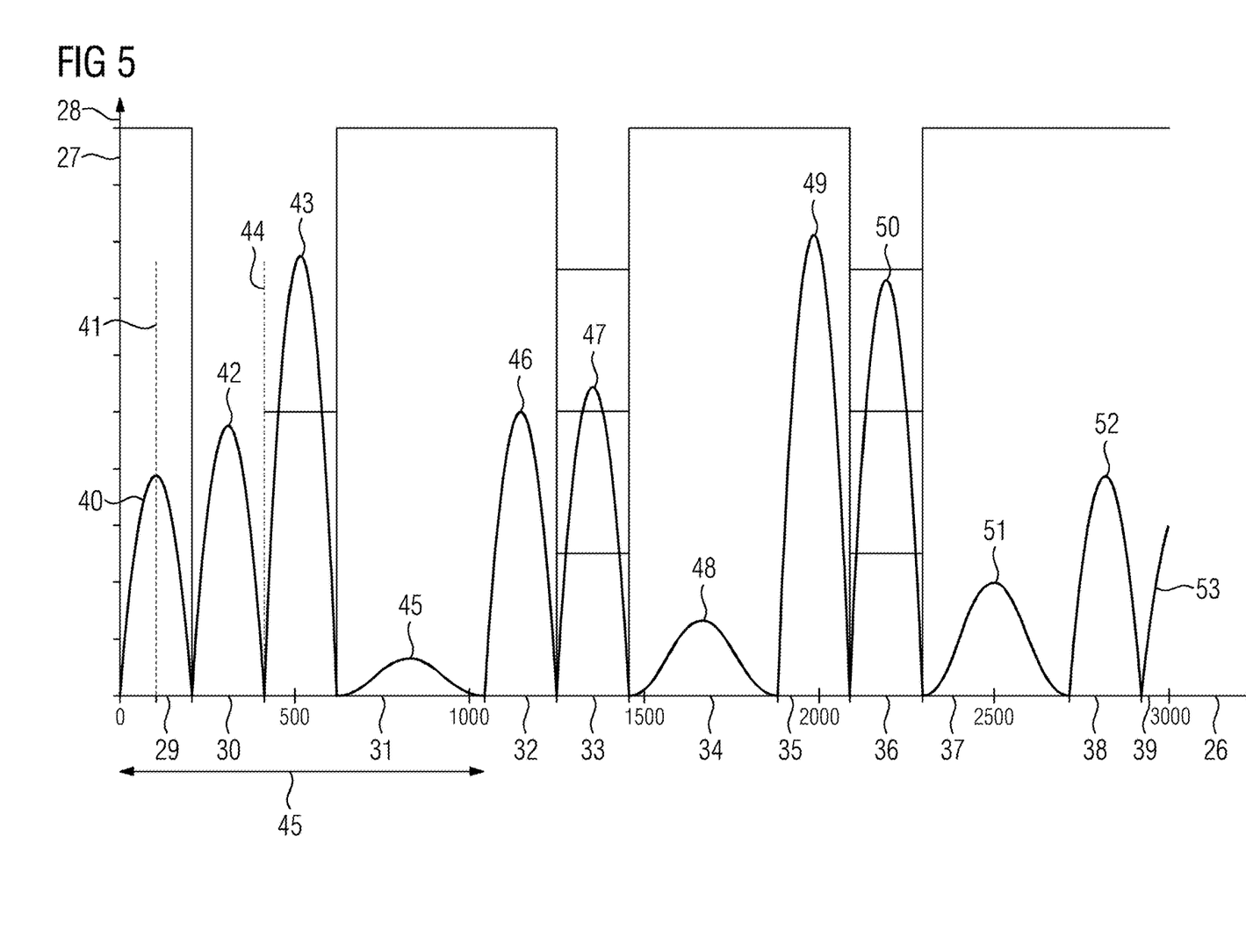
FIG. 5 shows a recording method having multiple measurement sequences.

FIG. 5 schematically illustrates a recording method for recording a magnetic resonance data set. Here the number of the recorded image data set is plotted on the axis 26 and different variables are plotted on the axis 27. Plotted as the first variable is the flip angle in ° from 0° at the origin to 90° at the axis point 28. The axis 26 runs from the image data set 1 to the image data set 3100.

The 3000 image data sets are distributed over eleven sections 29, 30, 31, 32, 33, 34, 35, 36, 37, 38 and 39.

In the first section 29, the FISP sequence flip angle that was used for the recording is plotted via the curve 40 for two hundred image data sets. As described in connection with FIG. 3, a complete image data set is recorded after the application of a radio-frequency pulse having a particular flip angle and then the next radio-frequency pulse having the next flip angle is applied and another image data set is acquired. FIG. 5 accordingly shows in section 29 a flip angle distribution which corresponds to a sine curve. The maximum flip angle is 24° and constant phases are used.

For the hundredth image data set, a line 41 has been inserted purely by way of example. The corresponding flip angle is the maximum flip angle of the curve 40.

In the second section 30, four hundred image data sets are acquired using the TrueFISP sequence 22 according to FIG. 4. Flip angles according to the curves 42 and 43 are used here.

For the curve 42 these extend to 45° and for the curve 43 to 72°.

Also for section 30, at the flip angle for the four hundredth image data set a line 44 has been inserted solely as an example. Here the flip angle is 1°.

A particular feature of section 30 is the use of two different phase cycles. For running through the flip angles of the curve 42, a 00 phase cycle i.e. no phase cycle is used and for running through the curve 43, a 180° phase cycle. A 00 phase cycle denotes a fixed phase.

In the following section 31, in the curve 45 the flip angles for recording four hundred and fifty image data sets using a FLASH sequence 11 are indicated. These are smaller than in the FISP or TrueFISP sequence and run up to 6°. Their distribution is also a $\sin^2$ distribution.

In addition to the variation of the flip angles, during repeated running of the FLASH sequence, a phase cycle for implementing RF spoiling is applied. As described, the phase is here increased by multiples of 117°.

The succession of the measurement sequences 11, 18 and 22 together constitute a block 45. This is used a total of three times in FIG. 5. Here the focus is solely on the type of sequence, but not on the number of image data sets or the flip angle curves (profiles).

In section 32, 200 image data sets are again recorded using a FISP sequence 18. As in section 29, the phase is constant, but the maximum flip angle is 45°. These lie on the curve 46.

In section 33, 200 image data sets follow which are to be acquired using a TrueFISP sequence 22. Here a 90° phase cycle is used, the maximum flip angle is 50°. The flip angles are plotted on the curve 47.

The next approximately 450 image data sets in section 34 are to be recorded using a FLASH sequence, as in section 31. The curve 48 shows a $\sin^2$ distribution with a maximum value of 14°.

Curve 49 in section 35 runs to 72° and shows the flip angles of the radio-frequency pulse 19 when using a FISP sequence 18 for the third time. The phase is also constant in this run.

For acquiring another two hundred image data sets using a TrueFISP sequence 22 according to FIG. 4, a 270° phase cycle is used. The flip angles that are plotted in the curve 50 run to 65°.

The next approx. 450 image data sets in section 37 are recorded using the FLASH sequence 11 according to FIG. 2. The curve 51 represents a flip angle evolution of up to 20°, again $\sin^2$-distributed.

In the last section 38, there are two curves 52 and 53 for recording image data sets using a FISP sequence. These again represent flip angle evolutions. As already in the preceding sections, a constant phase is used for the FISP measurement sequence 18.

To summarize, regardless of the specific number of images and the respective maximum flip angles, a $\sin^2$-distributed flip angle evolution is preferably used in all the sections. As described above, considerably fewer image data sets can also be acquired in a section, but preferably at least 10.

Figure 6:
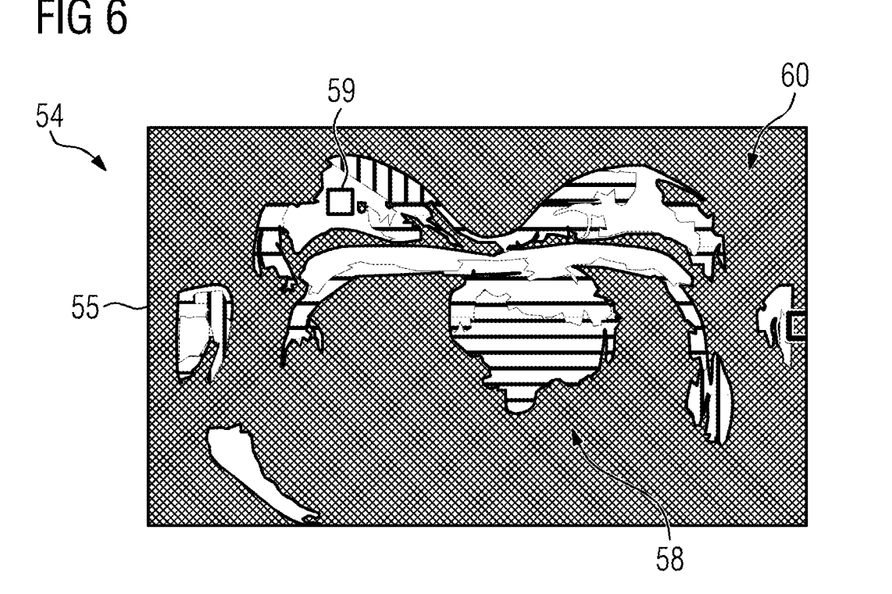
FIGS. 6-8 respectively show various magnetic resonance data sets.
Figure 7:
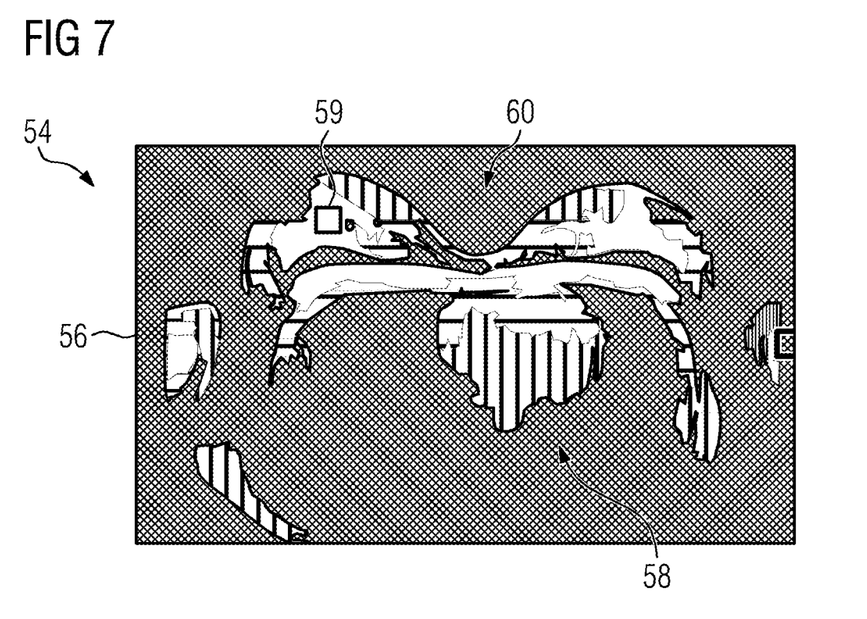
Figure 8:
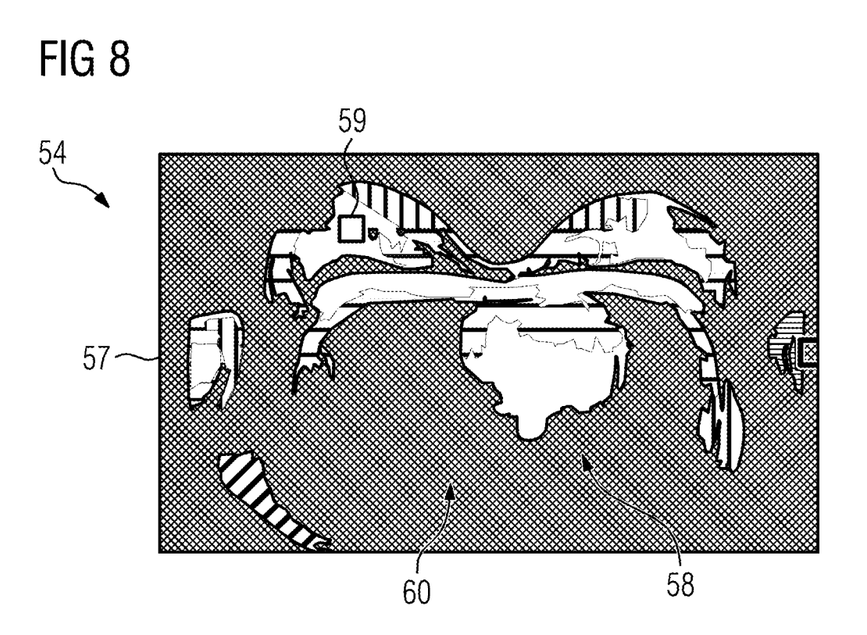

FIGS. 6 to 8 show a magnetic resonance data set 54 comprising image data sets 55, 56 and 57. These are illustrative of the 3000 image data sets obtained using the method according to FIG. 5. The necessary post-processing is generally known.

The image data sets 55, 56 and 57 each depict a region of interest 58. The image data set 55 has been recorded using the FISP measurement sequence 18, image data set 56 using the TrueFISP measurement sequence 22 and image data set 57 using the FLASH sequence 11. The flip angle is in each case one of the possible flip angles from the curves 40 to 53. However, the signal also depends on the past history.

The evaluation proceeds pixel by pixel. The pixel 59 is charted purely by way of example. In all the image data sets 55 to 57 the pixel at the same location, namely the pixel 59, is used to obtain a signal evolution. For the other pixels, a signal evolution is determined and evaluated in each case. The regions 60 in which only noise signal is present can be detected and omitted in order to minimize the evaluation time e.g. on the basis of a threshold value.

Figure 9:
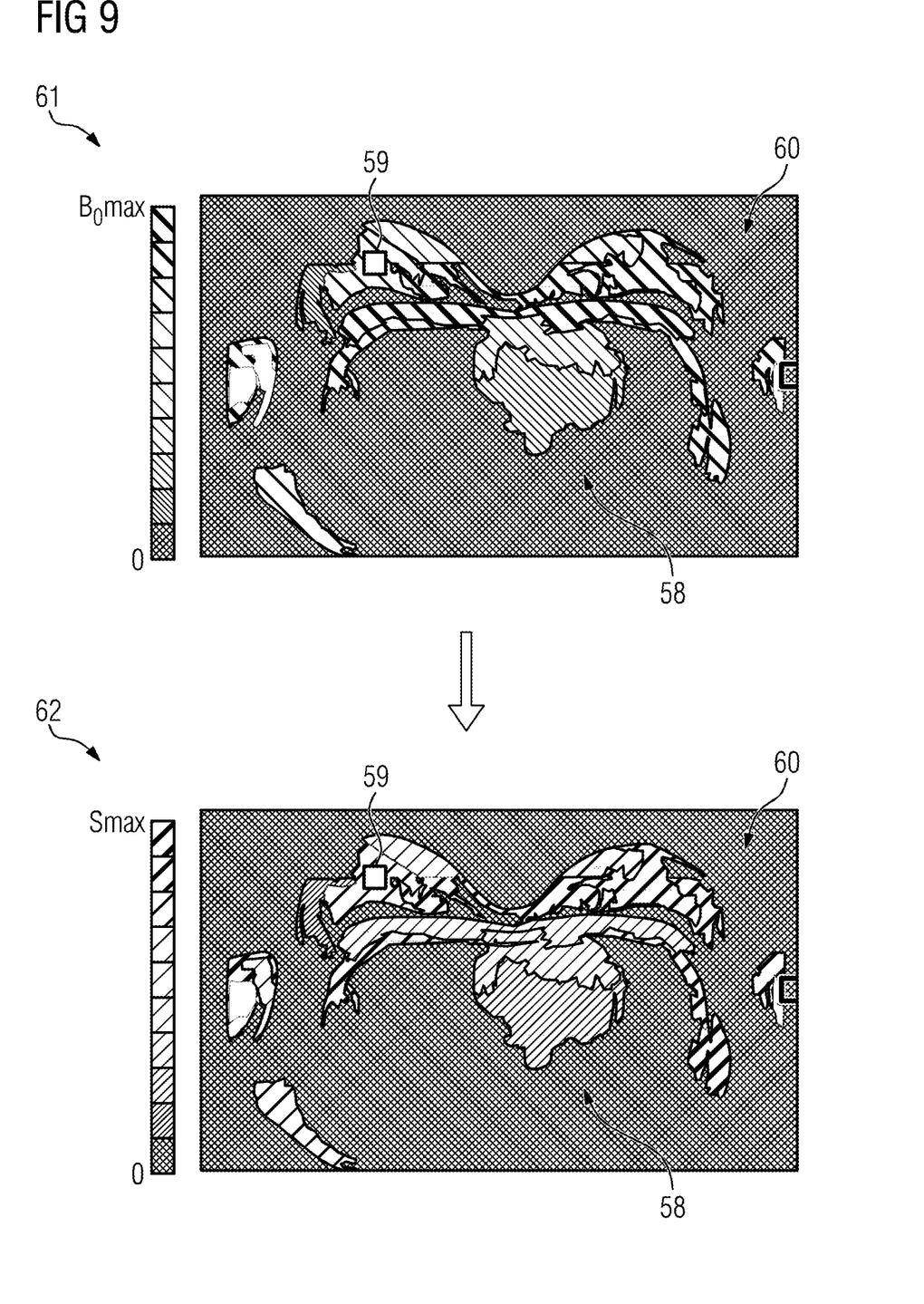
FIG. 9 shows a $B_0$ map and a susceptibility map.

FIG. 9 shows a $B_0$ map 61 which can be determined from the magnetic resonance data set 54. As described above, the pixel-by-pixel evaluation enables a $B_0$ value, a $B_1$ value, a $T_1$ value and a $T_2$ value to be determined for each pixel 59. Other parameters are also basically possible. The $B_0$ map 61 can be composed from all the $B_0$ values determined, as is normal for creating parameter maps.

As described, the $B_0$ map 61 can be calculated via a reference $B_0$ map and an extension $B_0$ map.

A susceptibility map 62 can be calculated from the $B_0$ map 61 by the use of a low-pass filter. This can avoid the use of phase maps.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a $B_0$ map of a region of interest in an magnetic resonance (MR) scanner comprising a basic field magnet that generates a static, basic magnetic field $B_0$, said method comprising:
   providing a computer with an MR data set comprising a plurality of image data sets obtained with said MR scanner by executing at least two measurement sequences, each of said MR data sets comprising pixels, with mutually corresponding pixels of the respective image data sets, each representing a time-dependent signal evolution;
   in said computer, generating said $B_0$ map of said region of interest from said image data sets with pixels in said $B_0$ map each having a value determined from the signal evolution of the mutually corresponding pixels in said image data sets that correspond to the respective pixels in the $B_0$ map;
   in said computer, comparing said signal evolutions with simulated signal evolutions in order to determine said $B_0$ value, or to determine said $B_0$ value and at least one other parameter value; and
   in said computer, simulating said signal evolutions in said computer only in a reduced $B_0$ value range,
   wherein said $B_0$ value range is limited to values of $-(1/T_r)/2$ to $+(1/T_r)/2$, wherein $T_r$ is a repetition time for acquiring said image data sets.

2. A method as claimed in claim 1 comprising, in said computer, deriving a susceptibility map from said $B_0$ map.

3. A method as claimed in claim 1 comprising deriving a susceptibility map from said $B_0$ map by eliminating low-frequency field changes from said $B_0$ map.

4. A method as claimed in claim 1 comprising deriving $B_1$ values, for a $B_1$ field in said MR scanner, from said signal evolutions.

5. A method as claimed in claim 1 comprising acquiring said magnetic resonance image data sets in at least two sections, with image data sets being recorded using a True-FISP measurement sequence and acquiring image data sets in another section using a FLASH measurement sequence.

6. A method as claimed in claim 5 comprising, in at least one of said at least two sections, acquiring said image data sets using a FISP measurement sequence.

7. A method as claimed in claim 1 comprising, upon completing said comparison with said simulated signal evolutions, determining reference $B_0$ values by extending the comparison to $B_0$ values outside of said reduced range.

8. A method as claimed in claim 7 comprising calculating an extension $B_0$ map in said computer, and comparing said extension $B_0$ map to said $B_0$ map in order to determine phase information pixel-by-pixel, and thereby transforming the $B_0$ values to a $B_0$ value range that contains values outside of said reduced $B_0$ value range.

9. A method as claimed in claim 1 comprising determining $T_1$ value and $T_2$ value from said signal evolutions.

10. A magnetic resonance (MR) apparatus comprising:
    an MR data acquisition scanner comprising a basic field magnet that generates a basic magnetic field $B_0$;
    a computer provided with an MR data set comprising a plurality of image data sets obtained with said MR scanner by executing at least two measurement sequences, each of said MR data sets comprising pixels, with mutually corresponding pixels of the respective image data sets, each representing a time-dependent signal evolution;
    said computer being configured to generate said $B_0$ map of said region of interest from said image data sets with pixels in said $B_0$ map each having a value determined from the signal evolution of the mutually corresponding pixels in said image data sets that correspond to the respective pixels in the $B_0$ map;
    said computer being configured to compare said signal evolutions with simulated signal evolutions in order to determine said $B_0$ value, or to determine said $B_0$ value and at least one other parameter value; and
    said computer being configured to simulate said signal evolutions in said computer only in a reduced $B_0$ value range,
    wherein said $B_0$ value range is limited to values of $-(1/T_r)/2$ to $+(1/T_r)/2$, wherein $T_r$ is a repetition time for acquiring said image data sets.

11. A non-transitory, computer-readable data storage medium encoded with programming instructions, said storage medium being loaded into a computer of a magnetic resonance (MR) apparatus comprising an MR data acquisition scanner that has a basic field magnet that produces a basic magnetic field $B_0$, said programming instructions causing said computer to:
    receive an MR data set comprising a plurality of image data sets obtained with said MR scanner by executing at least two measurement sequences, each of said MR data sets comprising pixels, with mutually corresponding pixels of the respective image data sets, each representing a time-dependent signal evolution;
    generate a $B_0$ map of said region of interest from said image data sets with pixels in said $B_0$ map each having a value determined from the signal evolution of the mutually corresponding pixels in said image data sets that correspond to the respective pixels in the $B_0$ map;
    compare said signal evolutions with simulated signal evolutions in order to determine said $B_0$ value, or determine said $B_0$ value and at least one other parameter value; and
    simulate said signal evolutions in said computer only in a reduced $B_0$ value range, wherein said $B_0$ value range is limited to values of $-(1/T_r)/2$ to $+(1/T_r)/2$, wherein $T_r$ is a repetition time for acquiring said image data sets.

* * * * *